United States Patent

Campardo et al.

[19]

[11] Patent Number: 5,903,498
[45] Date of Patent: May 11, 1999

[54] LOW-SUPPLY-VOLTAGE NONVOLATILE MEMORY DEVICE WITH VOLTAGE BOOSTING

[75] Inventors: Giovanni Campardo, Bergamo; Rino Micheloni, Turate; Stefano Commodaro, Bogliasco, all of Italy

[73] Assignee: STMicroelectronics, S.r.l., Agrate Brianza, Italy

[21] Appl. No.: 08/877,927

[22] Filed: Jun. 18, 1997

[30] Foreign Application Priority Data

Jun. 18, 1996 [EP] European Pat. Off. .............. 96830345

[51] Int. Cl.[6] ...................................................... G11C 7/00
[52] U.S. Cl. .............................. 365/185.23; 365/185.11; 365/185.18; 365/185.2; 365/189.11
[58] Field of Search .......................... 365/185.23, 185.11, 365/185.18, 185.2, 189.09, 189.11

[56] References Cited

U.S. PATENT DOCUMENTS

| 4,967,399 | 10/1990 | Kuwabara et al. | 365/230.06 |
| 5,333,122 | 7/1994 | Ninomiya | 365/189.11 |
| 5,528,536 | 6/1996 | Baldi et al. | 365/185.18 |

FOREIGN PATENT DOCUMENTS

| 0 187 375 A2 | 7/1986 | European Pat. Off. . |
| 0 656 629 A2 | 6/1995 | European Pat. Off. . |
| 2 094 086 | 9/1982 | United Kingdom . |

OTHER PUBLICATIONS

Roubik Gregorian et al., "Analog MOS Integrated Circuits for Signal Process," in a *Wiley Series on Filters, Design, Manufacturing, and Applications*, Wiley–Interscience Publication, New York, New York.

Primary Examiner—Vu A. Le
Attorney, Agent, or Firm—David V. Carlson; E. Russell Tarleton; Seed and Berry LLP

[57] ABSTRACT

The memory device has a plurality of local boost circuits, each connected to a sector of the memory array, and each having a control circuit, at least a respective boost capacitor, and a respective drive circuit. Each drive circuit is only enabled in read mode, on receiving an address-transition-detect signal and a sector enabling signal, for reading memory cells forming part of the respective sector. The boost voltage is only supplied to the final inverter of the row decoder. A clamping diode limits the boost voltage to prevent undesired direct biasing of the PMOS transistors of the final inverters connected to the nonaddressed word lines. And the overvoltage is therefore only supplied locally when and where necessary.

22 Claims, 3 Drawing Sheets

LOW-SUPPLY-VOLTAGE NONVOLATILE MEMORY DEVICE WITH VOLTAGE BOOSTING

TECHNICAL FIELD

The present invention relates to a low-supply-voltage nonvolatile memory device with voltage boosting.

BACKGROUND OF THE INVENTION

As is known, to read the cells of nonvolatile, and in particular flash, memories, the row to which the cell to be read is connected is so biased as to bring the gate terminal of the cell to the read voltage, and the current flowing through the cell is detected. If the cell is written, its threshold voltage must be higher than the read voltage, so that no current is conducted by the cell. If the cell is erased, its threshold voltage must be such as to let current through. And detecting the current flow provides for discriminating between written and erased cells.

To ensure correct read operation and reliable cycling (multiple cycle operation) of the memory array, certain limits are typically observed in the distribution of the threshold voltages of the cells. More specifically, currently used technologies require that the threshold voltage of the best erased cells be above zero, and the threshold voltage of the worst erased cells be about 2.5 V. The lower limit substantially arises from the need to ensure against read errors caused by depleted cells (cells with a threshold voltage below zero), while the upper limit is due to the intrinsic distribution of the cell threshold voltages according to the fabrication technology used.

Since the read voltage normally coincides with the supply voltage, a supply voltage of over 3 V poses no problems. A problem arises in the case of memories operating at low supply voltages $V_{CC}$. In fact, with a supply voltage $V_{CC}$ of 2.5 V, all the cells with a threshold voltage $V_t$ close to this value conduct little or no current, so that the cell is considered written, thus resulting in a read error.

One solution to the problem consists in boosting the read voltage, i.e., supplying the gate terminal of the cell to be read with a voltage higher than the supply voltage and generated by an appropriate booster stage. At present, two solutions based on this principle are known: continuous and pulsating boost.

In the continuous boost solution, a timed circuit supplied with a clock signal provides for gradually charging a boost capacitor to a voltage higher than the supply voltage. The boost capacitor then provides for maintaining a common (boost) line of the memory at the desired overvoltage. The advantage of this solution lies in the small size of the boost capacitor, due to the overvoltage being reached by means of a series of small increments. But precisely for this reason, initial charging, and hence access to the memory when turned on or on re-entry from standby, is very slow. To eliminate the latter delay, a second smaller boost circuit may be used to keep the boost capacitor charged in standby mode, but only at the expense of increased power consumption.

The pulsating boost solution, on the other hand, employs a very large boost capacitor, which is charged by a single pulse only at predetermined times (upon address switching in read mode, or active switching of the chip enabling signal). While solving the problems of slow access on re-entry from standby (or when the memory is turned on) and increased power consumption in standby mode, the pulsating solution presents other drawbacks of its own, due to the large area required for the capacitor and the necessary drive circuits.

SUMMARY OF THE INVENTION

It is an object of the present invention to provide a voltage booster for supplying a read voltage higher than the supply voltage, which at the same time provides for maintaining the advantages and minimizing the disadvantages of known pulsating and continuous boost solutions.

According to an embodiment of the present invention, a low-supply-voltage nonvolatile memory device includes a memory array, a first reference potential line, and a voltage boosting means that is connected to the reference potential line and that generates a boost voltage. The voltage boosting means includes a plurality of boost circuits that are each connected to a portion of the memory array and that each include at least a respective capacitive boost element and a respective drive circuit.

BRIEF DESCRIPTION OF THE DRAWINGS

A preferred, non-limiting embodiment of the present invention will be described by way of example with reference to the accompanying drawings, in which.

DETAILED DESCRIPTION OF THE INVENTION

Figure 1:
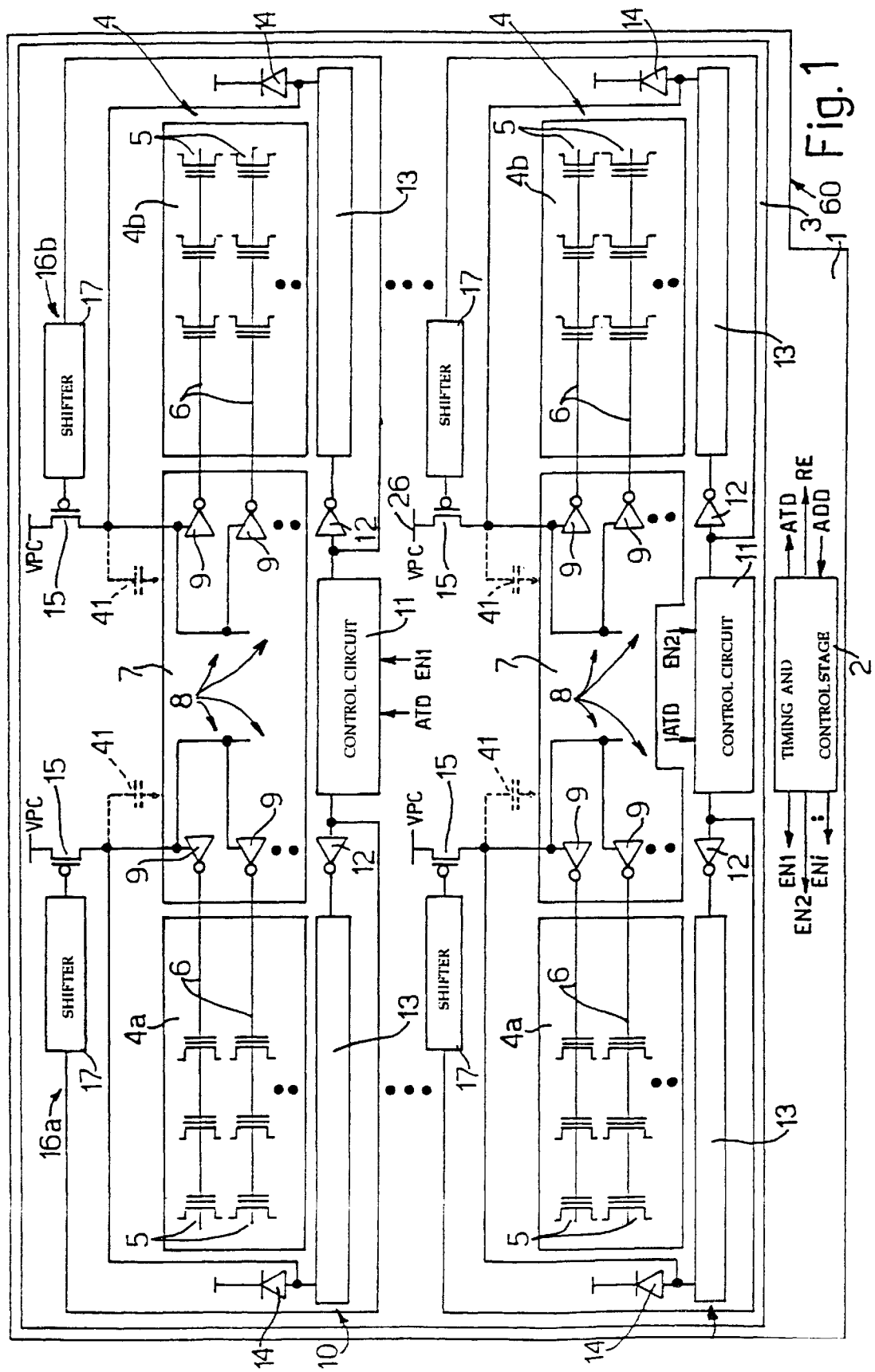
FIG. 1 shows a simplified diagram of the architecture of the memory device according to the invention and comprising a plurality of voltage boosters.

Number 1 in FIG. 1 indicates a memory device integrated in a substrate 60 of semiconductor material, and comprising a flash type nonvolatile memory, of which only the parts pertinent to the present invention are shown.

Memory device 1 comprises a timing and control stage 2 for generating the signals required to operate memory device 1, a memory array 3 comprising a plurality of sectors 4 (only two shown in FIG. 1) divided into two half-sectors—left 4a and right 4b—each comprising a plurality of memory cells 5 arranged in rows and columns, and the gate terminals of cells 5 in the same row and forming part of the same half-sector are connected in known manner to a same word line 6. Memory device 1 also comprises a plurality of row decoders 7, one for each sector 4, and each row decoder 7 comprises a plurality of decoding circuits 8 (of which only the final inverter 9 is shown in FIG. 1) for driving respective word lines 6. Each sector 4 is connected to a respective boost circuit 10, some parts of which may be common to both half-sectors 4a, 4b forming sector 4 and possibly also (in a manner not shown) to other sectors, while other parts of boost circuit 10 are duplicated for each half sector. The boost circuit 10 shown is therefore a local type for only supplying the boost voltage to the sector 4 to be read, and only when required.

As shown in FIG. 1, each boost circuit 10 comprises a control stage 11 common to both the half-sectors of the same sector 4, and two drive circuits 16a, 16b, each connected to a respective half sector 4a, 4b for driving a respective boost capacitor 13 of which only one armature is shown in FIG. 1. Each drive circuit 16a, 16b comprises an inverter 12 connected to a respective output of control stage 11, a clamping diode 14, a voltage shifter 17, and a coupling transistor 15 for connecting row decoding circuits 8 to a supply line 26 at voltage VPC (equal to $V_{CC}$ in read mode, and to $V_{PP}$ in programming mode).

Figure 2:
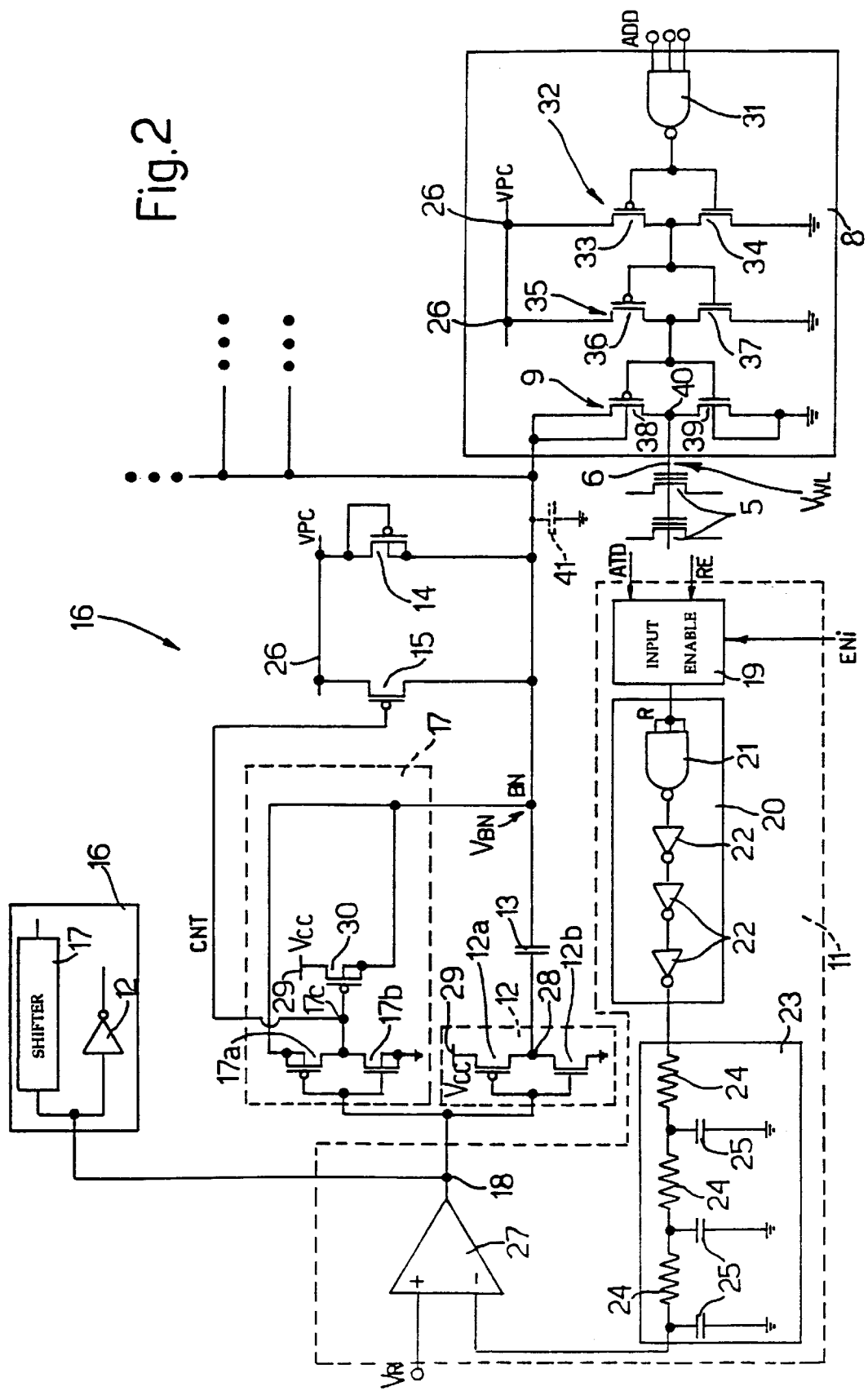
FIG. 2 shows an electric diagram of a first embodiment of a voltage booster forming part of the FIG. 1 memory device.

Referring to FIG. 2, control circuit 11 comprises an input enabling circuit 19, a dummy decoder 20, a dummy row 23, and a comparator 27.

Input enabling circuit 19 (which may comprise a simple flip-flop with an enabling input) presents a first input receiving an address transition pulse signal ATD generated by timing and control stage 2 (FIG. 1), a second input receiving a read-end pulse signal RE also generated by stage 2, and an enabling input receiving a signal ENi for enabling the i-th sector and also generated by stage 2 on the basis of address signals ADD. Input enabling circuit 19 generates an output signal R, which, in the presence of sector enabling signal Eni, switches to high on receiving the ATD pulse, and to low on receiving the RE pulse.

From the circuit and technological standpoint, dummy decoder 20 presents a structure as similar as possible to that of decoding circuits 8, so as to present the same propagation delay, and, in the example shown, comprises a NAND gate 21 supplied with signal R and driving three cascade-connected inverters 22. The output of dummy decoder 20 is connected to the input of dummy row 23, which is also designed to present the same electric, and in particular capacitive, parameters as word lines 6 of the array, FIG. 2 shows the electric equivalent of dummy row 23 comprising a plurality of resistors 24 connected in series between the input and output of dummy row 23, and a plurality of capacitors 25, each having one terminal grounded, and the other terminal connected to a respective common node between two successive resistors 24.

The output of dummy row 23 is connected to the inverting input of comparator 27, the noninverting input of which is supplied with a reference voltage $V_R$ representing a percentage of supply voltage $V_{CC}$, and the output of which defines a node 18 to which inverter 12 and shifter 17 are connected. More specifically, inverter 12 comprises a pair of respectively PMOS and NMOS transistors 12a, 12b connected between a supply line 29 at $V_{CC}$ and ground. The gate terminals of transistors 12a, 12b are connected to each other and to node 18, and the drain terminals are connected to each other, and define an output node 28 connected to one terminal of capacitor 13, the other terminal of which defines a node BN.

Voltage shifter 17 comprises a pair of respectively PMOS and NMOS transistors 17a, 17b connected between node BN and ground. The gate terminals of transistors 17a, 17b are connected to each other and to node 18. The drain terminals are connected to each other and define a node 17c presenting a signal CNT, and the bulk regions are connected to the respective source terminals (in turn connected respectively to node BN and ground). In practice, transistors 17a, 17b form an inverter supplied by node BN, as opposed to supply line 29, so that, when input node 18 is high at $V_{CC}$, output node 17c is grounded, whereas, when input node 18 is low, output node 17c is at the potential of node BN (higher than $V_{CC}$ in boost mode, as explained in more detail later on).

Output 17c of voltage shifter 17 is connected to the gate terminal of a PMOS control transistor 30 for connecting/disconnecting node BN to/from supply line 29 at $V_{CC}$, and having the source terminal connected to supply line 29 at $V_{CC}$, and the drain terminal and bulk region connected to each other and to node BN. Output 17c is also connected to the gate terminal of coupling transistor 15, which has the drain terminal connected to node BN, and the source terminal connected to supply line 26 at VPC.

Clamping diode 14 is interposed between node BN and supply line 26, and is here formed by a PMOS transistor with the drain and gate terminals connected to supply line 26, and the source terminal and bulk region connected to node BN, so that it is equivalent to a diode with the anode connected to node BN. Node BN is also connected to final inverters 9 of row decoding circuits 8 forming part of the same half-sector 4a, 4b.

More specifically, and as shown in FIG. 2, row decoding circuit 8 comprises an input NAND gate 31 having a plurality of inputs supplied with address signals ADD generated by timing and control stage 2 and possibly decoded by a predecoding circuit (not shown). The output of NAND gate 31 is connected to a first inverter 32 comprising, in known manner, a pair of complementary MOS transistors 33, 34 interposed between supply line 26 and ground. The output of first inverter 32 is connected to the input of a second inverter 35 also comprising a pair of complementary MOS transistors 36, 37 connected between supply line 26 and ground and the output of second inverter 35 is connected to the input of final inverter 9 also comprising a pair of complementary transistors 38, 39 but interposed in this case between node BN and ground. More specifically, transistor 38 is a PMOS type with the source terminal and bulk connected to node BN, the gate terminal connected to the gate terminal of transistor 39 and to the output of second inverter 35, and the drain terminal forming an output node 40 connected to word line 6 and to the drain terminal of transistor 39, which is an NMOS type with the source terminal and bulk grounded.

Between node BN and ground, there is also shown a parasitic capacitor 41, which represents the capacitances of the well regions of PMOS transistors 38, the junction capacitances, and other parasitic capacitances connected to node BN.

In the FIG. 1 diagram, which shows schematically the overall layout of boost circuit 10, each boost capacitor 13 comprises a polysilicon region over and insulated electrically (in known manner), from an active region (not shown) of substrate 60, each capacitor 13 being located close to respective half-sector 4a, 4b. And, as explained in more detail later on, diodes 14 are located adjacent to respective capacitors 13 to rapidly limit the voltage at nodes BN. In a manner not shown, the outputs of comparators 27 are connected to voltage shifters 17. Nodes 17c of the voltage shifters are connected over short connecting lines to the gate terminals of coupling transistors 15. Capacitors 13 are made slightly resistive in a conventional manner to ensure rapid turn-off of transistors 30 and 15 before nodes BN are boosted by pulling up capacitors 13, as explained in more detail later on and dummy decoders 20 and dummy rows 23 are advantageously formed using "edge rows" (located at the edges of the memory array sectors to safeguard the memory cells in known manner against edge effects).

Boost circuit 10 in FIGS. 1 and 2 operates as follows. Prior to read-addressing a cell (signal ATD low), signal R is low, the output of dummy decoder 20 is low, the output of comparator 27 is high, and output 28 of inverter 12 and signal CNT at output 17c are low. Thus, control transistor 30 is turned on and connects node BN to supply line 29 at $V_{CC}$, while the terminal of capacitor 13 connected to node 28 is grounded, so that capacitor 13 is charged to $V_{CC}$. At this time, transistor 15 is also on.

On address transition signal ATD switching to high to read a cell in the relative sector (signal ENi of the relative sector high), signal R switches to high and the output of NAND gate 21 switches to low. With a delay simulating the propagation delay along the rows in the memory array, the voltage at the inverting input of comparator 27 increases exponentially, and, on reaching value $V_R$ equal to a predetermined fraction of the supply voltage, switches the output of comparator 27 to low, thus switching inverter 12 and voltage shifter 17. The voltage at node 28 is therefore brought to $V_{CC}$. Signal CNT switches to high, and follows the dynamics of node BN described below to short the gate and drain terminals (the latter now operating as a source terminal by presenting the maximum potential) of transistors 15 and 30, which are turned off immediately to separate node BN from supply lines 26 and 29, both at $V_{CC}$, and so boost node BN and supply final inverter 9 of row decoding circuit 8 with voltage $V_{BN}$.

In the absence of clamping diode 14, the division due to parasitic capacitor 41 would bring the voltage at node BN to a value $V_{BN,1}$ of:

$$V_{BN,1} = V_{CC}\left(1 + \frac{C_B}{C_P + C_B}\right) \quad (1)$$

where $C_B$ is the capacitance of boost capacitor 13, and $C_P$ that of parasitic capacitor 41. When transferred to the row to be read via PMOS transistor 38 of final inverter 9 driving the addressed row 6 (the address of which coincides in known manner with that at the input of NAND gate 31), the above voltage would bring the addressed line 6 to a high read voltage ensuring correct reading of the cell, but, on the other hand, would cause biasing problems as regards the nonaddressed rows, in that the PMOS transistors 38 of their final inverters 9 would have the gate terminal biased at supply voltage $V_{CC}$ and the source terminal at the above voltage $V_{BN}$. As such, PMOS transistors 38 of the nonaddressed rows would not definitely be turned off, thus resulting in stress of the nonaddressed row cells, in undesired grounding (and discharge) of nodes BN by inadvertently turned-on transistors 38, and in undesired consumption, thus defeating the voltage boost function.

The purpose of clamping diodes 14, on the other hand, is precisely that of only permitting node BN to be boosted to voltage $V_{CC}+V_T$, where $V_T$ is the voltage drop across diode 14. As shown in FIG. 2, diodes 14 are advantageously in the form of PMOS transistors similar to transistors 38 but diode-connected, so that voltage drop $V_T$ equals the threshold voltage of transistors 38, and, as the voltage at node BN tends to exceed $V_{BN,2}=V_{CC}+V_T$, it is prevented from doing so by diode 14 conducting and so discharging boost capacitor 13 in controlled manner towards ground. The voltage drop between the source and gate terminals of transistors 38 driving the nonaddressed rows therefore equals the threshold voltage of transistors 38, which, even if close to being turned on, remain off.

This therefore permits the read voltage of the addressed cells to be bootstrapped at a value which, even if only slightly higher than the supply voltage, is normally sufficient to ensure correct reading of the cells, and may be increased if necessary by providing native transistors 14 and 38 (i.e., with a high threshold voltage unaltered during fabrication).

When the addressed cells have been read and read-end signal RE switches to high, signal R switches back to zero, control circuit 11 switches, node 18 switches back to high, and nodes 17c and 28 switch back to low to turn on transistors 15 and 30 and recharge boost capacitor 13 to $V_{CC}$.

Boost circuit 10 as described provides for solving the slow access problems typically associated with known continuous boost circuits by boosting the read voltage by means of a single pulse. Moreover, only a small area is required, by virtue of employing a number of local boost capacitors 13 (for each sector or half-sector), which, being small, may be integrated in unused areas of the chip or, at any rate, in such areas as to optimize the layout of the memory.

The short connections between node 18 and voltage shifters 17, and between voltage shifters 17 and coupling transistors 15, ensure transistors 15 (and control transistors 30) are turned off by shorting the gate and drain terminals before node BN is boosted, thus ensuring the correct sequence of events and, as stated, the location of clamping diodes 14 close to the terminal of capacitor 13 connected to node BN ensures the diodes are turned on before the PMOS transistors of final inverters 9.

Another point to note is that, the read voltage is not boosted for the whole of line 26 at VPC, but only for the addressed sector and the overvoltage is only supplied to the final inverter by virtue of the presence of coupling transistors 15 and the relative control circuit, thus ensuring local, timed application of the overvoltage to the circuits driving the addressed rows, and permitting the use of small-size components (such as coupling transistor 15 and boost capacitor 13).

Using a dummy decoder and row to generate the control signal ensures the control signal is synchronized correctly, the boost function is activated before the supply voltage reaches the cell to be read, and boosting is effected exactly (and only) when required. Such synchronization provides for optimizing the efficiency of the circuit and, among other things, for reducing the size of the circuit components. In selecting the trigger value of comparator 27, a trade-off is made between the voltage obtainable and the time taken for it to be reached. The maximum voltage obtainable is given by equation (1) if the initial voltage of node BN equals $V_{CC}$. On the other hand, the row voltage is exponential in time, so that, after one time constant, it is already at 63% of its maximum value, and, to reach values of over 90%, requires 4 to 5 time constants, which would result in an excessively long access time when reading the cells. The selected 70% value, corresponding, in the solution shown, to a delay of about 10 ns, ensures a time related to the time constant of the row.

Figure 3:
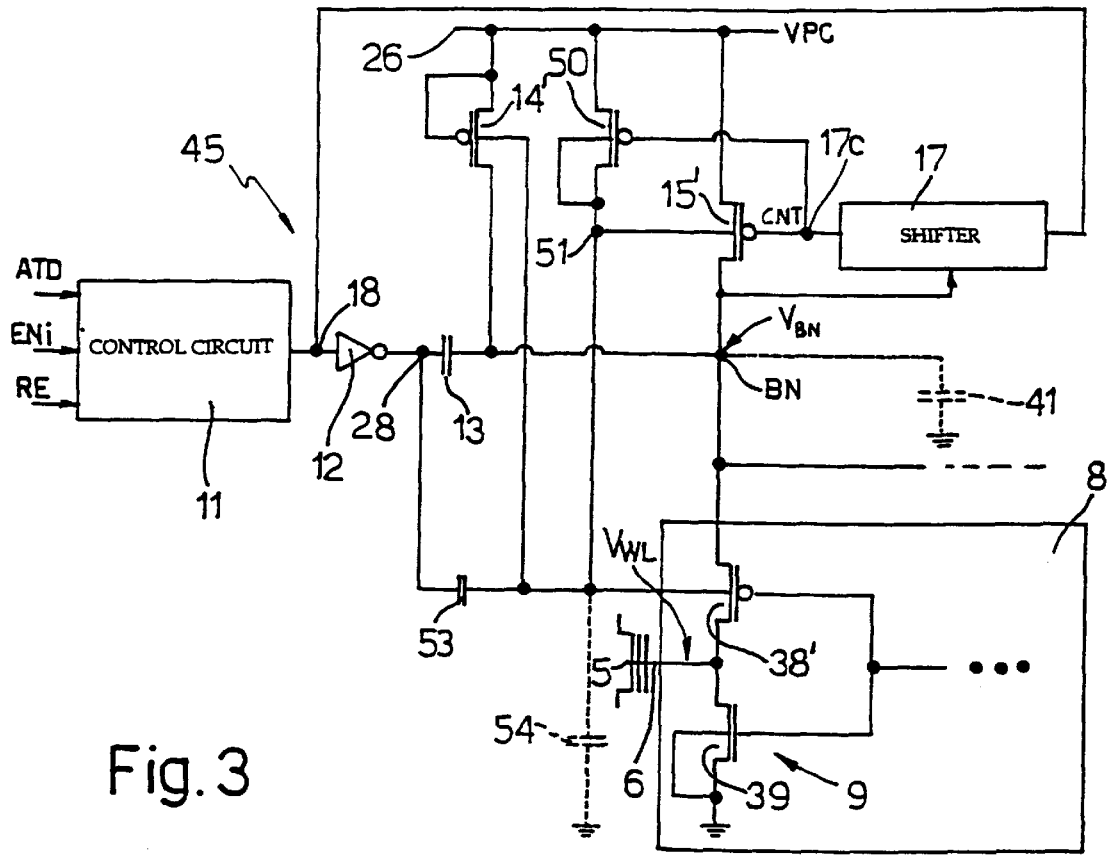
FIG. 3 shows an electric diagram of a second embodiment of the voltage booster.

FIG. 3 shows a second embodiment of the invention by which to obtain a higher boost voltage as compared with the solution of FIGS. 1 and 2. In FIG. 3, any parts common to the first embodiment are indicated using the same numbering system with no further description. Only one drive circuit, indicated in this case by 45, is shown in detail. Control circuit 11, voltage shifter 17 and inverter 12 are shown only schematically for the sake of simplicity and only final inverter 9 of row decoding circuit 8 is shown.

Drive circuit 45 differs from circuit 16 in FIG. 2 by presenting a PMOS transistor 50 for biasing the bulk regions of transistors 14', 15' and 38', which are similar to transistors 14, 15 and 38 in FIG. 2 and are indicated with an apex to show the different connection of the respective bulk regions. More specifically, transistor 50 has the source terminal connected to supply line 26, the gate terminal connected to output node 17c of voltage shifter 17, and the drain terminal and bulk region connected to a node 51 to which the bulk regions of transistors 14', 15' and 38' are also connected. In addition to boost capacitor 13, already present in the FIG. 2 circuit, provision is also made for a second boost capacitor 53 between nodes 28 and 51. FIG. 3 shows a parasitic capacitor 54 representing the capacitances of the bulk regions of transistors 14', 15' and all the transistors 38' in the same half-sector 4a, 4b and driven by the same circuit 45.

The FIG. 3 circuit operates as follows.

Prior to reading the cell, when the voltage at node 18 is high, outputs 28 and 17c of inverter 12 and voltage shifter 17 are low. Transistors 15' and 50 are turned on, thus connecting node BN (and control transistor 30 not shown) to supply voltage VPC, and biasing the bulk regions of transistors 14', 15', 38' at $V_{CC}$ and capacitors 13 and 53 are connected in parallel and charged to $V_{CC}$. Upon signal ATD switching so that the voltage at node 18 falls and the voltage at nodes 28 and 17c increases, transistors 15' and 50 are both turned off to disconnect nodes BN and 51 from supply line 26 and the voltages at nodes BN and 51 are boosted by capacitors 13 and 53, respectively. By appropriately sizing the boost capacitors as explained below, the voltage at node 51 may be increased by a greater amount than that at node BN, also bearing in mind that node BN is limited by clamping diode 14', and that the threshold voltage of clamping diode 14' is affected by the voltage at node 51. In fact, as is known (so-called body effect), the threshold voltage $V_T$ of a MOS transistor is given by the following equation (see, e.g., the text of Gregorian, Temes "Analog MOS Integrated Circuits for Signal Processing", John Wiley & Sons):

$$|V_T| = |V_{TO}| + \gamma\left(\sqrt{2|\phi_p| + |V_{SB}|} - \sqrt{2|\phi_p|}\right) \quad (2)$$

where $V_{SB}$ is the voltage drop between the source terminal and bulk region, $V_{TO}$ is the threshold voltage in the event the bulk region is connected to the source terminal ($V_{SB}$=0), $\gamma$ is a constant depending on the fabrication process, and $\phi_p$ is a constant depending on the bulk material.

In drive circuit 45 in FIG. 3, therefore, when the voltage at node 51 exceeds $V_{BN}$ at node BN, a voltage $V_{SB}$ of other than zero is generated in transistors 14', 38', which therefore present a higher threshold voltage $V_T$ than in the FIG. 2 solution. In particular, the sizing of boost capacitors 13, 53 depends on the parasitic capacitance associated with respective nodes BN and 51, and hence on the voltage division ratio obtainable according to equation (1). With 256 memory cells per row and a capacitance of 25 pF and 50 pF for capacitors 13 and 53 respectively, the discussed methods provide for a 200 mV increase in threshold voltage $V_T$ (equal to about 1 V in the case of the FIG. 2 circuit).

Transistor 50 provides for precharging node 51 to supply voltage $V_{CC}$ and preventing direct biasing of the bulk-source junctions of the PMOS transistors by rapidly connecting node 51 to supply line 26.

Since transistors 14' and 38' of drive circuit 45 in FIG. 3 present the same connection of the bulk regions to node 51 and hence the same threshold voltage, diode 14' safely prevents excessive boosting of node BN and hence undesired turn-on of transistors 38' connected to the nonaddressed rows.

Figure 4:
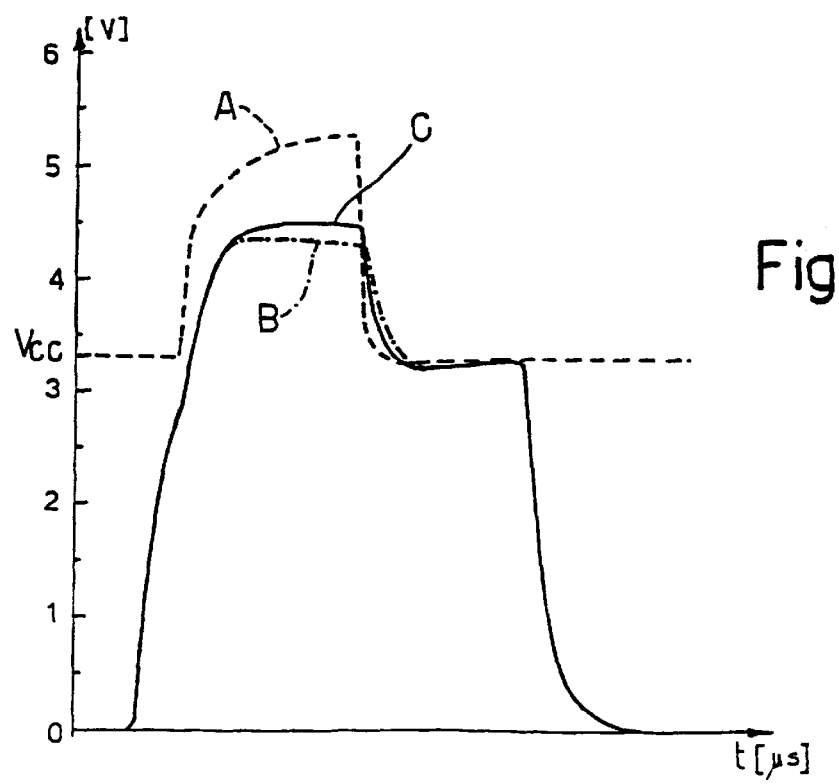
FIG. 4 shows a time graph of some voltages that were generated in simulations of the boosters of FIGS. 2 and 3.

Simulated voltages obtainable using the FIG. 2 and 3 circuits are shown in the FIG. 4 graph, in which A indicates the voltage at node 51 in FIG. 3, B indicates voltage $V_{WL}$ at the end of word line 6 in the FIG. 2 circuit, C indicates voltage $V_{WL}$ in the FIG. 3 circuit, and T the end-of-bootstrap instant.

Clearly, changes may be made to the circuit as described and illustrated herein without, however, departing from the spirit and scope of the present invention. In particular, the local boost capacitors may be formed using appropriate areas of the chip, e.g., existing dummy rows, as opposed to polysilicon/active area capacitors as described. The control circuit may differ from that described, providing it ensures correct read timing and synchronization, and may either be duplicated for each half-sector or drive a number of sectors by locally enabling drive circuits 16 or 45 by means of appropriate conventional decoding portions of the address and row decoding may be effected by the control circuit itself, or by using the corresponding decoding or even only conventional predecoding circuits already provided for in row decoders 7.

We claim:

1. A memory circuit, comprising:
    a supply terminal coupled to receive a supply voltage;
    a nonvolatile memory cell having a control terminal;
    a booster circuit that is coupled to the supply terminal and that is operable to generate a boosted read voltage on a booster terminal during a reading of the memory cell, the boosted read voltage being higher than the supply voltage;
    a transistor that has a first threshold voltage and that is coupled to the control terminal of the memory cell and to the booster terminal, the transistor operable to couple the boosted read voltage to the memory cell; and
    a clamp circuit that is coupled to the booster terminal and to the supply terminal, the clamp circuit operable to prohibit the boosted read voltage from significantly exceeding the sum of the supply voltage and the first threshold voltage.

2. The memory circuit of claim 1 wherein the booster circuit comprises:
    a capacitor having a first terminal coupled to the booster terminal and having a second terminal; and
    a switch circuit that is coupled to the second terminal of the capacitor, the switch circuit operable to charge the capacitor substantially to the supply voltage and operable to couple the second terminal of the capacitor to the supply terminal during the reading of the memory cell.

3. The memory circuit of claim 1 wherein the clamp circuit comprises a diode-connected transistor that has a second threshold voltage that is substantially equal to the first threshold voltage.

4. The memory circuit of claim 1, further comprising:
    wherein the clamp circuit comprises a diode-connected transistor that has a second threshold voltage; and
    a bias circuit that is coupled to the transistor and to the diode-connected transistor, the bias circuit operable to increase the first and second threshold voltages substantially to a boosted threshold voltage during the reading of the memory cell, the boosted threshold voltage being higher than the first and second threshold voltages.

5. The memory circuit of claim 1, further comprising:
    wherein the clamp circuit comprises a diode-connected transistor that has a second threshold voltage that is substantially equal to the first threshold voltage; and
    a bias circuit that is coupled to the transistor and to the diode-connected transistor, the bias circuit operable to increase the first and second threshold voltages by substantially equal amounts during the reading of the memory cell.

6. The memory circuit of claim 1, further comprising:
    wherein the transistor has a first bulk region;
    wherein the clamp circuit comprises a diode-connected transistor that has a second bulk region and a second threshold voltage that is substantially equal to the first threshold voltage;
    a capacitor having a first terminal coupled to the first and second bulk regions and having a second terminal; and a switch circuit that is coupled to the second terminal of the capacitor, the switch circuit operable to charge the capacitor substantially to the supply voltage and operable to couple the second terminal of the capacitor to the supply terminal during the reading of the memory cell.

7. A method for reading a memory cell having a control terminal, the method comprising:

generating a boosted read voltage that is higher than a supply voltage;

coupling the boosted read voltage to the control terminal with a transistor to read the memory cell, the transistor having a threshold voltage; and limiting the boosted read voltage to a maximum of the threshold voltage plus the supply voltage.

8. The method of claim 7, further comprising:

generating a read signal on a word line that is coupled to the control terminal of the memory cell; and delaying the generating of the boosted read voltage substantially until the read signal has propagated to the memory cell.

9. The method of claim 7 wherein the generating comprises:

charging a capacitor to the supply voltage, the capacitor having a first terminal coupled to the transistor and having a second terminal, first terminal positive with respect to the second terminal; and coupling the second terminal to the supply voltage while reading the memory cell.

10. A low-supply-voltage nonvolatile memory device comprising a memory array having a plurality of sectors, a first reference potential line, and voltage boosting means connected to said reference potential line and generating a boost voltage, wherein said voltage boosting means comprise a plurality of boost circuits, each connected to a respective sector of said memory array, and each comprising at least a respective capacitive boost element and a respective drive circuit, and wherein each said sector is divided into two half-sectors, and wherein each boost circuit comprises at least a control circuit, and two half boost circuits in turn comprising respective capacitive boost elements and respective drive circuits.

11. A device as claimed in claim 10 wherein each sector of said memory array comprises a plurality of word lines and a plurality of row decoding circuits, each row decoding circuit being connected to a respective word line and comprising a logic circuit and a final inverting element, said logic circuit having an address input receiving address signals, and a biasing input connected to a second reference potential line, and said final inverting element having an output connected to said respective word line, and a biasing input connected to a respective capacitive boost element.

12. A device as claimed in claim 10 wherein each said boost circuit comprises an enabling input receiving a read timing signal, and enabling means for controlling said drive circuit in the presence of said read timing signal.

13. A device as claimed in claim 12 wherein said enabling means comprise a decoding simulation circuit receiving said read timing signal and a sector enabling signal, and generating an enabling signal in the presence of said read timing signal and of predetermined values of said address signal, a row simulation circuit presenting delay means receiving said enabling signal and generating an electric quantity of increasing level, and a comparing element receiving said electric quantity and a reference signal, and generating a boost control signal when the level of said electric quantity is at least equal to said reference signal.

14. A device as claimed in claim 13 wherein said reference signal presents a level equal to a fraction of said reference potential.

15. A device as claimed in claim 10 wherein each said capacitive boost element is formed in a dummy row.

16. A device as claimed in claim 10 wherein each said capacitive boost element comprises a region of semiconductor material over and insulated electrically from a substrate region of semiconductor material.

17. A device as claimed in claim 10 wherein each said drive circuit comprises a switching element interposed between said first reference potential line and a first terminal of a respective capacitive boost element, said switching element having a control terminal connected to a boost control node in turn connected to a second terminal of said respective capacitive boost element, the device comprising a controlled coupling element interposed between said first terminal of said respective capacitive boost element and a second reference potential line, and having a control terminal connected to said boost control node.

18. A device as claimed in claim 17 wherein each said drive circuit comprises a clamping element interposed between said first terminal of said respective capacitive boost element and said second reference potential line.

19. A device as claimed in claim 18 wherein said clamping element comprises a diode having an anode terminal connected to said first terminal of said capacitive boost element.

20. A device as claimed in claim 17, further comprising a voltage shifter interposed between said control terminal of said switching element and said boost control node.

21. A device as claimed in claim 17 wherein each said drive circuit comprises a capacitive biasing element and a bulk biasing switch, said capacitive biasing element having a first terminal connected to said second terminal of said capacitive boost element, and a second terminal defining a bulk biasing node, and said bulk biasing switch being interposed between said second reference potential line and said bulk biasing node, wherein each said sector comprises a plurality of row decoding circuits, each in turn comprising a respective final inverter, and in that said bulk biasing switch, said clamping element and the final inverters each comprise a respective PMOS transistor having a bulk region connected to said bulk biasing node.

22. A device as claimed in claim 21, wherein said capacitive boost and biasing elements are so sized as to bring said bulk biasing node to a voltage higher than said first terminal of said capacitive boost element.

* * * * *